Nov. 17, 1970 J. D. HELMS 3,541,223

INTERCONNECTIONS BETWEEN LAYERS OF A MULTILAYER PRINTED CIRCUIT BOARD

Original Filed Sept. 23, 1966

INVENTOR
John D. Helms 3,541,223

INTERCONNECTIONS BETWEEN LAYERS OF A MULTILAYER PRINTED CIRCUIT BOARD

John D. Helms, Dallas, Tex., assignor to Texas Instruments Incorporated, Dallas, Tex., a corporation of Delaware

Original application Sept. 23, 1966, Ser. No. 581,539, now Patent No. 3,489,877, dated Jan. 13, 1970. Divided and this application Mar. 25, 1969, Ser. No. 810,104
Int. Cl. H05k *1/04*
U.S. Cl. 174—68.5 2 Claims

ABSTRACT OF THE DISCLOSURE

Vertical interconnections between multilayer printed circuit boards are made by embedding a wire into a hole formed through the stacked boards. The hole is formed through the various circuit elements to be interconnected and the insulating layers. A wire is introduced into the hole with a tool which impresses the wire laterally into the surface wall of the hole and the various circuit elements to be interconnected. A current is then passed through the wire which causes it to bond to the conductive elements.

This application is a division of copending application Ser. No. 581,539, filed Sept. 23, 1966, now Pat. No. 3,489,877.

This invention relates to multilayer printed circuit boards and, more particularly, to a method of forming electrical interconnections between the various layers of conductors in a multilayer printed circuit board.

The advent of new technology in electronic circuit component design has resulted in high component-density packaging. Consequently, where large numbers of circuit components are concentrated in a relatively limited space, it is necessary that a large number of electrical interconnections between these components coexist commensurate with the complexity and number of circuit functions to be performed. One of the problems in circuit packaging, then, is the development of an efficient method of making reliable interconnections in high component-density configurations; for example, in multilayer or composite printed circuit boards.

Two methods presently employed in forming vertical interconnections in multilayer boards are the plated-hole technique and the fused-post technique. Each requires that a hole be formed through the various circuit board layers and the conductive elements thereon so that a continuous hole runs between the two most vertically separated conductive elements to be interconnected. In the plated-hole technique, the inside surface of the hole is sensitized to accept metal plating and thereafter plated with electroless copper. The conducting path between the various vertically displaced conductors is provided by the plated hole and its interconnections with the conductors on the various levels. A poor connection between a plated hole and an internal element can result from the smear of the substrate on the edge of a hole formed by drilling. Such a smear results from the flow of substrate material induced by high temperatures which occur during drilling, and can act as an insulator between the plated hole and the edge of the element which it covers. The plated-hole technique is also prone to faulty bonds due to stress environments in the multilayer board.

In the fused-post technique, a pre-formed post or tube is driven into the hole and then heated to a temperature sufficient to allow solder to flow from the post to the elements in contact with it. This method relies on intimate physical contact between the post and the conductive elements in order that the latter may be properly heated to accept solder flow. A gap between the post and the element can result in an unreliable cold joint. Thus, smears which can arise during drilling can be detrimental to this method. The utilization of this technique can also result in damage to the laminates of the multilayer board when the post is heated to soldering temperature; out-gassing of the substrate material occurs which, in effect, is a vaporization process resulting in enlargement of the hole.

It is therefore an object of this invention to provide a method of forming reliable vertical or *z*-axis interconnections in multilayer circuit boards in an efficient and inexpensive manner.

It is a further object of the invention to provide a method of making vertical or *z*-axis interconnections in multilayer circuit boards which may be performed by computer-activated tools.

Various other objects, features and advantages of the invention will become apparent from the following description in conjunction with the appended claims and the attached drawing in which:

Figures 1, 2, 3:
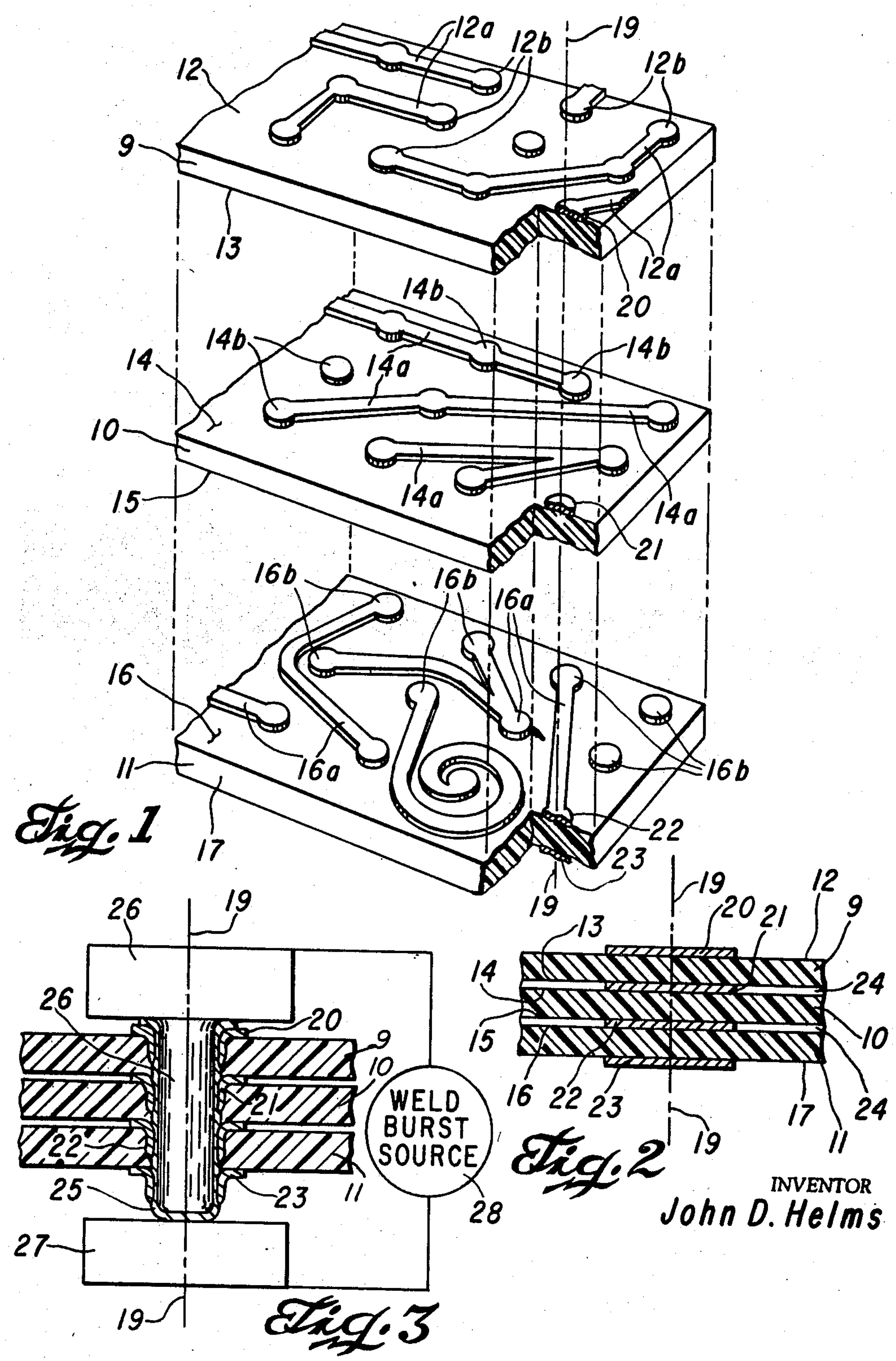
FIG. 1 is a pictorial view in section of a segment of a multilayer printed circuit board.
FIG. 2 is an elevational view in section of a segment of a printed circuit board in which an interconnection is to be made.
FIG. 3 is an elevational view in section of a segment of a printed circuit board in which an interconnection has been made. Apparatus for making said interconnection is also illustrated therein.

The figures of the drawings are not to scale, but have been distorted in an attempt to make normally small details clearly discernable.

In brief, the invention comprises the following indicated steps. A hole is formed, for example by drilling, through the various elements to be interconnected. A conducting element such as a wire is introduced into the hole with a tool which impresses the wire laterally into the surface wall of the hole and into the various conductive elements to be interconnected. A current is then passed through the wire which causes it to bond to the said conductive elements. When a wire of diameter small compared to that of the hole is used, plastic deformations of the metallic foils comprising the conducting elements result, the foils partially encircling the wire. Wrap-around type contacts are thus formed between the wire and the various foils being interconnected. The embossing of the interconnecting element into the conducting circuit elements obviates any difficulties which may be present in other methods due to substrate smear produced during drilling. The high temperature of the interconnecting wire during bonding has been found not to cause any serious damage to the substrate layers. Outgassing is not a problem in the procedure.

The invention presents a method which is readily performable by computer-driven tools inasmuch as the procedure is basically mechanical in nature and requires neither external heat sources nor plating baths.

Referring now to FIG. 1, there are illustrated three insulative sheets 9, 10 and 11. These sheets may be of glass filled epoxy or other suitable material. It will be seen that surfaces 12, 14, 16 and 17 have thereon conductive configurations (the conductor configuration on surface 17 being partially shown) such as are commonly used in printed circuitry, i.e., strips of conductors **12*a*, 14*a* and 16*a* between respective ones of dots 12*b*, 14*b* and 16*b* of conductive material. The conductive material most generally used is copper. The arrangement pictured is only representative of one of the configurations which are used in printed circuitry. In alternate arrangements, conductor configurations may appear on both top and bottom surfaces of each layer 9, 10 and 11. Electronic components may also be integrated with the conductors on various layers. In the present embodiment, the dot patterns on the various surfaces are arranged so that particular dots on each surface have common center lines. For example, center line 19—19 is the center line of the sectional dots 20, 21, 22 and 23 existing on surfaces 12, 14, 16 and 17**, respectively.

Referring now to FIG. 2, there is shown a sectional view of a fragment of a composite board which has been formed by bonding together three insulative sheets with patterns of conducting elements thereon such as those shown in FIG. 1. The dots 20, 21, 22 and 23 of FIG. 1 are shown sectionally with corresponding center line 19—19. The bonding material is indicated by 24 and may be epoxy resin or another suitable adhesive.

FIG. 3 corresponds generally to FIG. 2 except that a circular hole has been formed through the composite board through all the aligned dots which are to be interconnected and the apparatus for forming the interconnection is in position. The hole may be formed by conventional drilling techniques. A U-shaped wire 25 of small diameter compared to that of the hole is introduced into the hole by means which causes the wire to become embedded in the surface wall of the hole itself. Such means may be an instrument adapted to push the U-shaped wire 25 into the hole, extrude the wire into the surface wall of the hole, and cause the wire to come in contact with the various conducting foils 20, 21, 22 and 23 to be interconnected. Means suitable for effecting this result could be a circular rod of diameter substantially the same as, or slightly smaller than, that of the hole itself. As long as the effective diameter of the insertion tool plus twice the diameter of the connecting wire is greater than the diameter of the hole, the wire will become embossed in the insulating laminates and the foils thereon. The insertion tool should be tapered or rounded at one end, as shown, for entering into the hole. Since the surface wall of the hole consists of alternate layers of insulative material and conducting foils, it is clear that the wire 25 will become embedded in both the epoxy resin layers 9, 10 and 11 and the foils 20, 21, 22 and 23 thereon. It may be seen that deformations of the conducting foils have occurred at the points at which the interconnecting wire 25 meets the conducting foils 20, 21, 22 and 23 to form wrap-around type contacts.

Once the interconnecting wire 25 has been mechanically impressed into the laminate, the welds by which the wire is permanently bonded to the foils may be formed. A current supplied by the weld-burst source 28 passes into an electrode 26, through the wire 25, a second electrode 27, and then back through the source, thus traversing a complete electrical path. It is desirable that the resistance of the wire 25 be less than the resistance of the electrode 26 in order that the bulk of the current may flow through the wire and not through the electrode 26. In this manner, ohmic heating will occur in the wire 25 and raise its temperature to a level at which it will braze or weld to the foils 20, 21, 22 and 23. A solder-coated Dumet wire of diameter .005" has been found adequate for the purpose.

Once the welds in one hole have been formed, the electrodes may be removed and repositioned on the complete printed circuit board over another hole therein so that another interconnection may be formed in the manner already described. The electrode 26 may serve both to insert the wire into the hole and form part of the brazing circuit. This would result in a more efficient, reliable and inexpensive procedure in two ways. First, the time-consuming mechanical operation of removing the insertion tool and replacing it with an electrode would be eliminated. The complexity and cost of the apparatus used would also be decreased with the elimination of this operation. Second, if the insertion tool and the electrode 26 are not accurately positioned on the same axis, improper contact between the wire 25 and the electrode 26 may result and thus produce an imperfect weld.

Once all vertical interconnections have been completed, components may be positioned on surface 12 with their leads extending through appropriate holes below the bottom surface 17 of the board. Bath soldering may then be used to fix these leads to the dots on surface 17.

The procedure described above may be performed by a tool activated by computer output signals. The tool can thus be used to perform its operations on various circuit board patterns merely by changing the operative computer program designed for a particular conductor configuration.

While the invention has been described with reference to an illustrative embodiment, it is understood that this description is not to be construed in a limiting sense. For example, the method described above is not restricted solely to use with circuit boards in which holes running between the various circuit elements are formed by drilling. The method is equally well-suited for use with circuit boards in which holes are formed by other methods, for example by punching.

Furthermore, the method also applies to circuit boards in which separate layers, each having pre-formed holes in appropriate positions, are joined together to form a composite or multilayer board. Other embodiments of the invention, as well as modifications of the disclosed embodiment, will appear to persons skilled in the art.

What is claimed is:

1. A multilayer circuit board comprising:

(a) selected layers of insulating material, each having a pattern of conductive ribbons on the surface thereof with holes selectively provided through said layers and ribbons, said layers being positioned one on top of the other in stacked arrangement with said holes in vertical alignment through said layers; and (b) common conducting elements each having a width and depth no larger than half the diameter of said holes, said conducting elements being embedded in the sides of said holes and to said conductive ribbons at points in said holes where said conductive elements and said conductive ribbons are contiguous.

2. The multilayer circuit board of claim 1, wherein said common conductive elements are wires each having a diameter smaller than half the diameter of said holes.

References Cited

UNITED STATES PATENTS 2,740,097 3/1956 Edelman et al.
3,253,324 5/1966 Frey et al.
3,264,524 8/1966 Dahlgren et al.

DARRELL L. CLAY, Primary Examiner

U.S. Cl. X.R.

317—101; 339—17